(12) United States Patent
Couriol et al.

(10) Patent No.: US 12,117,316 B2
(45) Date of Patent: Oct. 15, 2024

(54) RESISTIVE SENSOR INTERFACE

(71) Applicant: University of Utah Research Foundation, Salt Lake City, UT (US)

(72) Inventors: Matthieu Couriol, Salt Lake City, UT (US); Pierre-Emmanuel Gaillardon, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 135 days.

(21) Appl. No.: 18/159,895

(22) Filed: Jan. 26, 2023

(65) Prior Publication Data

US 2024/0255315 A1  Aug. 1, 2024

(51) Int. Cl.
*H03M 3/00* (2006.01)
*G01D 5/16* (2006.01)

(52) U.S. Cl.
CPC ...................... *G01D 5/16* (2013.01)

(58) Field of Classification Search
CPC ....................................................... G01D 5/16
See application file for complete search history.

(56) References Cited

U.S. PATENT DOCUMENTS

| | | |
|---|---|---|
| 5,184,500 A | 2/1993 | Krema et al. |
| 6,812,708 B2 | 11/2004 | Bristol |
| 7,072,779 B2 | 7/2006 | Hancock et al. |
| 7,182,845 B2 | 2/2007 | Kaiser |
| 9,494,547 B2 | 11/2016 | Tsukada et al. |
| 9,863,911 B2 | 1/2018 | Wang et al. |
| 10,782,263 B2 | 9/2020 | Looney et al. |
| 11,099,213 B2 * | 8/2021 | Gaggl ............... G01R 27/2605 |
| 11,199,516 B2 | 12/2021 | Ranganathan et al. |
| 2018/0356455 A1 | 12/2018 | Rice |
| 2019/0391109 A1 | 12/2019 | Hagino et al. |
| 2021/0011066 A1 | 1/2021 | Maccioni et al. |

FOREIGN PATENT DOCUMENTS

CN  101873108  10/2010

OTHER PUBLICATIONS

Gomez-Ramirez et al., A Highly Robust Interface Circuit for Resistive Sensors, Electronics 2019, 8, 263; doi:10.3390/electronics8030263, 12 pages.
Kakela et al., A micropower RC oscillator chip for consumer ASIC applications, IEEE; ISBN:0-87942-655-1, 1991, 3 pages.

* cited by examiner

*Primary Examiner* — Alesa Allgood
(74) *Attorney, Agent, or Firm* — Thorpe North & Western, LLP

(57) ABSTRACT

A sensor interface for a resistive sensor has an analog front end comprising. The analog front end has an analog input/output (I/O) sensor port to be coupled to the resistive sensor. An integration stage is coupled to the analog I/O sensor port to oscillate at an oscillation frequency proportional to a sensor resistance of the resistive sensor. The integration stage has a variable integrator capacitance to vary the oscillation frequency. A gain stage is coupled to the integration stage and has a variable gain to vary the oscillation frequency of the integration stage. The sensor interface also has a smart digital controller (SDC) coupled to the analog front end to compute the sensor resistance of the resistive sensor based on the oscillation frequency. In addition, the SDC automatically detects unstable oscillation in the integration stage and causes the variable gain and the variable integrator capacitance to change.

20 Claims, 9 Drawing Sheets

RESISTIVE SENSOR INTERFACE

STATEMENT REGARDING FEDERALLY SPONSORED RESEARCH OR DEVELOPMENT

This invention was made with government support under grant D19AP00028 awarded by the Department of Defense/DARPA. The government has certain rights in this invention.

CROSS REFERENCE TO RELATED APPLICATIONS

Not Applicable.

NAMES OF THE PARTIES TO A JOINT RESEARCH AGREEMENT

Not applicable.

INCORPORATION BY REFERENCE STATEMENT

Not applicable.

BACKGROUND

There are various types of resistive sensors that can be used in a wide range of applications. For example, some cities are equipped with chemical monitoring stations to ensure they meet air quality requirements. These stations can detect a large set of chemicals at very low concentrations. These stations, however, may not be deployed as a high-density network across the cities due to their cost, power consumption and/or size.

SUMMARY

This invention relates to a sensor interface for a resistive sensor with an analog front end comprising. The analog front end has an analog input/output (I/O) sensor port to be coupled to the resistive sensor. An integration stage is coupled to the analog I/O sensor port to oscillate at an oscillation frequency proportional to a sensor resistance of the resistive sensor. The integration stage has a variable integrator capacitance to vary the oscillation frequency. A gain stage is coupled to the integration stage and has a variable gain to vary the oscillation frequency of the integration stage. The sensor interface also has a smart digital controller (SDC) coupled to the analog front end to compute the sensor resistance of the resistive sensor based on the oscillation frequency. In addition, the SDC automatically detects unstable oscillation in the integration stage and causes the variable gain and the variable integrator capacitance to change.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

Figure 1:
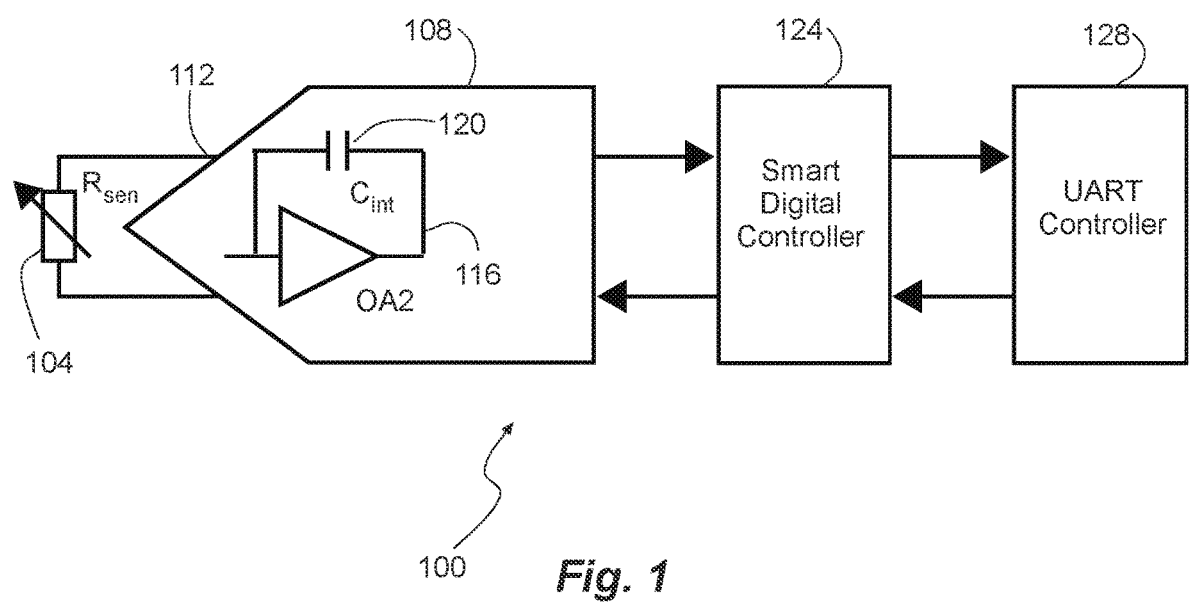
FIG. 1 is a schematic diagram of a sensor interface for a resistive sensor in accordance with one example.

These drawings are provided to illustrate various aspects of the invention and are not intended to be limiting of the scope in terms of dimensions, materials, configurations, arrangements or proportions unless otherwise limited by the claims.

DETAILED DESCRIPTION

While these exemplary embodiments are described in sufficient detail to enable those skilled in the art to practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

Definitions

In describing and claiming the present invention, the following terminology will be used.

The singular forms "a," "an," and "the" include plural referents unless the context clearly dictates otherwise. Thus, for example, reference to "a pathogen" includes reference to one or more of such materials and reference to "the electrode" refers to one or more of such electrodes.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

As used herein, the term "about" is used to provide flexibility and imprecision associated with a given term, metric or value. The degree of flexibility for a particular variable can be readily determined by one skilled in the art. However, unless otherwise enunciated, the term "about"

generally connotes flexibility of less than 2%, and most often less than 1%, and in some cases less than 0.01%.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, the term "at least one of" is intended to be synonymous with "one or more of." For example, "at least one of A, B and C" explicitly includes only A, only B, only C, or combinations of each.

Numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of about 1 to about 4.5 should be interpreted to include not only the explicitly recited limits of 1 to about 4.5, but also to include individual numerals such as 2, 3, 4, and sub-ranges such as 1 to 3, 2 to 4, etc. The same principle applies to ranges reciting only one numerical value, such as "less than about 4.5," which should be interpreted to include all of the above-recited values and ranges. Further, such an interpretation should apply regardless of the breadth of the range or the characteristic being described.

Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

Example Embodiments

A technology is described for a low-power, low-cost universal resistive sensor interface that can be used with resistive sensors, such as resistive gas sensors be used in gas monitoring applications. For example, a dense network of low-cost sensors may better estimate ozone. The universal sensor interface may keep the overall price of the network low by decrease the price of the sensor interface. Prior gas sensors, such as semiconductor gas sensors or Micro-Electromechanical Systems-based (MEMS) gas sensors, can be resistive. The intrinsic resistance of the gas sensors can vary proportionally with the concentration of exposed chemicals. The universal resistive sensor interface may greatly reduce the price of a gas-monitoring platform.

The mixed-signal interface can have an analog front end with an input port for directly interfacing the resistive sensor and a Smart Digital Controller (SDC) for computing the resistor value and resisting saturation of the analog front-end during the conversion. The computed value can be transmitted through an integrated universal asynchronous receiver-transmitter (UART) controller every 10 ms to 200 ms. The UART controller can have universal compatibility with embedded systems. The analog front end can have a continuous time integrator. The sensor resistance $R_{sen}$ can be placed in an integration stage defined by its time constant ($\tau = R_{sen} \cdot C_{int}$, where $C_{int}$ the integrator capacitance of an integration capacitor). The SDC can then compare the integrator time constant t to a defined and configurable time reference to compute the value of Rsen. The interface shows a fivefold improvement in terms of sampling frequency and threefold increase in measurement error with respect to prior interfaces. Dynamic range can also be increased by 20 dB against prior resistor interfaces. The interface can be implemented on an Application Specific Integrated Circuit (ASIC) and can be fabricated in a 180 nm CMOS process that can fit up to five sensor interfaces in a 5 mm$^2$ die with each sensor interface demonstrating a relative error of <0.35% from 5 kΩ to 50 GΩ. The front end can have a power consumption that can be kept below 5.5 mW.

In one aspect, such a sensor interface can be utilized in an air quality monitoring station, such as in a large-field array of low-cost sensors combined with artificial intelligence techniques to better estimate ozone compared to having a smaller number of costly sensors.

FIG. 1 illustrates a sensor interface 100 for a resistive sensor 104. The sensor interface 100 can be a resistance-to-digital interface. The resistive sensor 104 can have a sensor resistance $R_{sen}$ that can vary based on exposure to ambient conditions. In one aspect, the resistive sensor 104 can be a resistive gas sensor with an intrinsic resistance that can vary proportionally with a concentration of an exposed chemical. The sensor interface 100 can have an analog front end 108 that can be directly connected to the resistive sensor 104. The analog front end 108 can have an analog input/output (I/O) sensor port 112 to be coupled to the resistive sensor 104.

The analog front end 108 can also have an integration stage 116 coupled to the analog I/O sensor port 112. The integration stage 116 can be or can comprise integration circuitry, an integrator and/or an integration operational amplifier (OA). The integration stage 116 and the analog front end 108 can oscillate at an oscillation frequency that is proportional to the sensor resistance $R_{sen}$ of the resistive sensor 104. The integration stage 116 can have an integration operational amplifier OA2 coupled to the resistive sensor 104. The integration stage 116 can also have a variable integrator capacitance $C_{int}$ coupled across the integration operational amplifier OA2 to vary the oscillation frequency. The variable integrator capacitance $C_{int}$ can be provided by a variable capacitor 120. The integration stage 116 can oscillate as a function of the sensor resistance $R_{sen}$ of the resistive sensor 104 and the capacitance $C_{int}$ of the integration capacitor 120. In addition, the integration stage 116 can have an integrator time constant (t, tau) which is the product of the sensor resistance $R_{sen}$ and the variable integrator capacitance $C_{int}$ ($\tau$, tau=$R_{sen} \cdot C_{int}$). The variable integrator capacitor 120 can ensure the stability of the integration stage 116 and the analog front end 108, and can ensure maximum resolution for different values of the sensor resistance $R_{sen}$, as discussed in greater detail herein.

The I/O sensor port 112 of the analog front end 108 can directly interface the resistive sensor 104 and to a Smart Digital Controller (SDC) 124. Thus, the SDC 124 can be coupled to the analog front end 108. The SDC 124 can compute the sensor resistance $R_{sen}$ of the resistive sensor 104 based on the oscillation frequency and by comparing the integrator time constant ($\tau$, tau) to a time reference, as discussed in greater detail herein. The SDC 124 can also automatically detect unstable oscillation in the integration stage 116 and cause the variable integrator capacitance $C_{int}$ (and a variable gain G discussed herein) to change.

The analog front end 108 can be or can comprise a resistance-to-frequency converter that can achieve a high dynamic range (e.g. 141 dB). The sensor interface 100 can have an operating range of 5 kΩ to 50 GΩ. The circuit of the analog front end 108 and the integration stage 116 can oscillate based on a variable resistance ($R_{in}$ or $R_f$ discussed herein) and the integrator capacitor 120. The digital circuitry of the SDC 124 can measure the time constant ($\tau = R_{sen} \cdot C_{int}$) using a reference clock and can compute the value of the sensor resistance $R_{sen}$. In one aspect, the sensor resistance $R_{sen}$ enables determination of a concentration of the gas exposed to the sensor resistor 104.

Once the value of the sensor resistance $R_{sen}$ is computed, it can be sent over a Universal Asynchronous Receiver Transmitter (UART) controller 128. The UART controller 128 can be coupled to the SDC 124 and can transmit the sensor resistance $R_{sen}$ computed by the SDC 124. In one aspect, it can be sent with 8 bits of data and every 10 ms to 200 ms.

Figure 2:
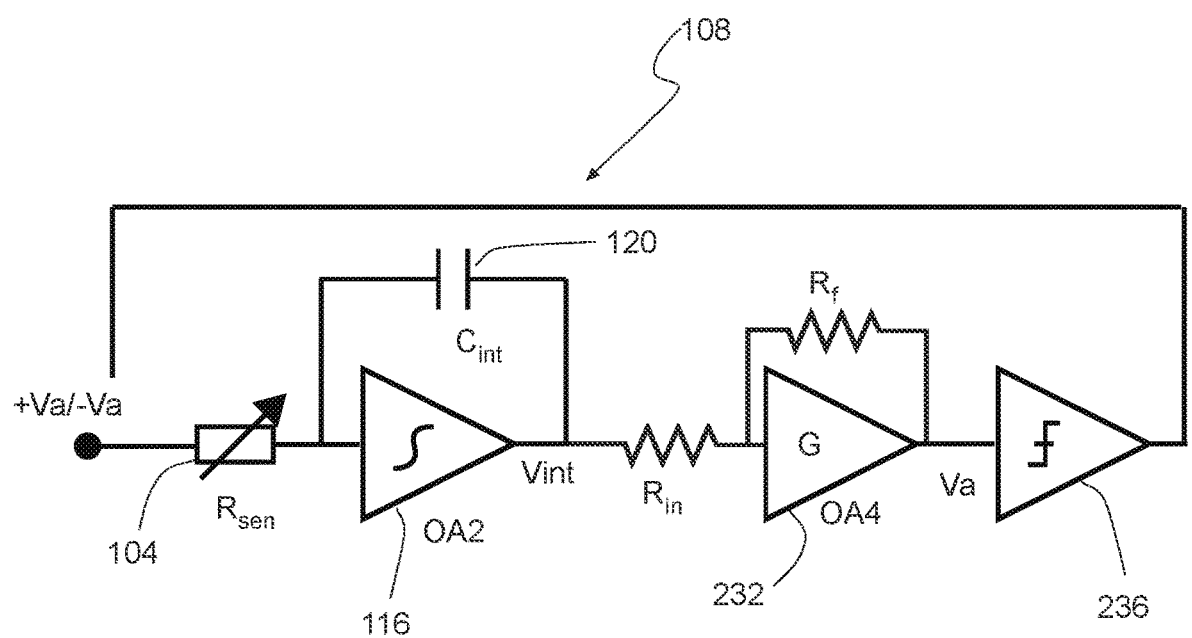
FIG. 2 is a simplified schematic diagram of an analog front end of the sensor interface of FIG. 1.

FIG. 2 illustrates a portion of the analog front end 108. The analog front end 108 can also have a gain stage 232 coupled to the integration stage 116. The gain stage 232 can have a variable gain G to vary the oscillation frequency of the integration stage 116. The variable gain G can be provided by a variable resistor ($R_{in}$ or $R_f$) that is separate and distinct with respect to the sensor resistance $R_{sen}$ of the resistive sensor 104. The gain stage 232 of the analog front 108 can have an operational amplifier OA4 with a gain G determined by a resistance ratio of resistors coupled to the operational amplifier OA4. The resistors coupled to the operational amplifier OA4 can comprise an input resistor $R_{in}$ coupled to the OA4 and a feedback resistor $R_f$ across the operational amplifier OA4.

In some cases, the circuit of the front end 108 can trigger a front-edge signal every time the integration stage 116 is charged. The integration stage 116 can be considered charged when its output reaches the value of Va/G and a comparator 236 is triggered, switching the input voltage to be Vin=−Va. The circuit then discharges the integration capacitor 120 with a constant current $I_{int} = V_a / R_{sen}$. The oscillation frequency of this feedback loop is defined by equation (1) where $T_{comp}$ refers to the time difference between two front-edges, t is the time constant of the integration stage 116, and G is the gain of the amplifying stage 232.

$$Tcomp = \frac{4 \cdot \tau}{G} \quad (1)$$

The value of the sensor resistance $R_{sen}$ is then computed by comparing how many times the integration stage 116 is triggered during a much slower reference time. The reference time can be generated using a 40 MHz clock of the sensor interface 100 or the SDC 124. The SDC 124 counts how many times the integration stage 116 triggers, and this value is defined as Ncomp. The sensor interface 100 or the SDC 124 is then able to precisely determine τ and thus, the value of the sensor resistance Rsen following equation (2).

$$R_{sen} = \frac{G \cdot T}{4 \cdot C} = \frac{G}{4 \cdot C} = \frac{Nck \cdot Tck}{Ncomp} \quad (2)$$

The variable gain G (and a resistor array described herein) from the amplifying stage 232 and the variable integrator capacitance Cint of the integrator capacitor 120 (and a capacitor array described herein) can be automatically configured by the SDC 124 or manually by commands from the UART controller 128, as discussed in greater detail herein. The variable gain G (and variable resistor) and the variable capacitance Cint of the variable capacitor 120 can ensure the stability of the integration stage 116 and the analog front end 108, as discussed in greater detail herein. In addition, the variable gain G and the variable capacitor 120 can provide maximum resolution for different values of the sensor resistance $R_{sen}$. Table I shows an example of different configurable ranges to interface different values of the sensor resistance $R_{sen}$. The integration stage 116 can be placed before the amplifying stage 232 and can toggle at $V_{int} = V a / G$. Increasing the gain G of the amplifying stage 232 makes the integration stage 116 oscillate faster as its output amplitude decreases. This effect is similar to reducing the variable integrator capacitance Cint of the integration stage 116 in that a smaller capacitor 120 charges faster to Va.

TABLE 1

Configurable ranges of the ASIC.

| Range | $R_{sen}$ | Gain | $C_{int}$ |
|---|---|---|---|
| Min. Range | [5 kΩ; 3 MΩ] | 1 V/V | 500 pF |
| Med-Low Range | [2.5 MΩ; 570 MΩ] | 10 V/V | 100 pF |
| Med-High Range | [170 MΩ; 1.5 GΩ] | 100 V/V | 100 pF |
| High Range | [750 MΩ; 500 GΩ] | 100 V/V | 0.35 pF |

Figure 3:
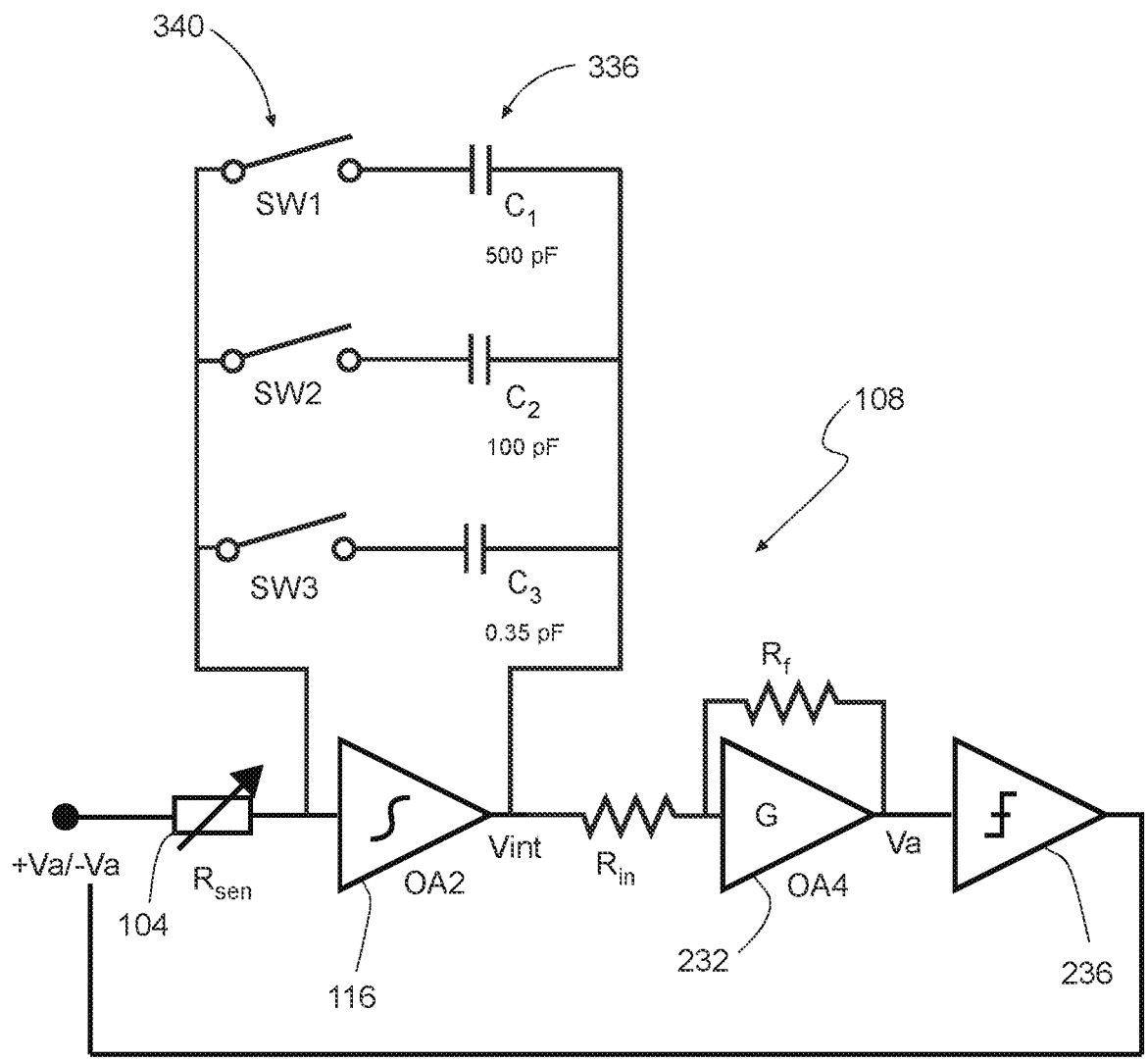
FIG. 3 is a schematic diagram of the analog front end with an array of capacitors of the sensor interface of FIG. 1.

FIG. 3 further illustrates a portion of the analog front end 108. The integration stage 116 and the integrator capacitor 120 of the analog front end 108 can comprise an array 336 of different capacitors C1-C3 selectively connectable to the integration operational amplifier OA2. In addition, an array 340 of switches can be coupled between an input and the array 336 of different capacitors C1-C3. In one aspect, each capacitor C1-C3 can be associated with a different switch. The SDC 124 (FIG. 1) can control the switches to change the variable integrator capacitance Cint across the integration operational amplifier OA2.

Figure 4:
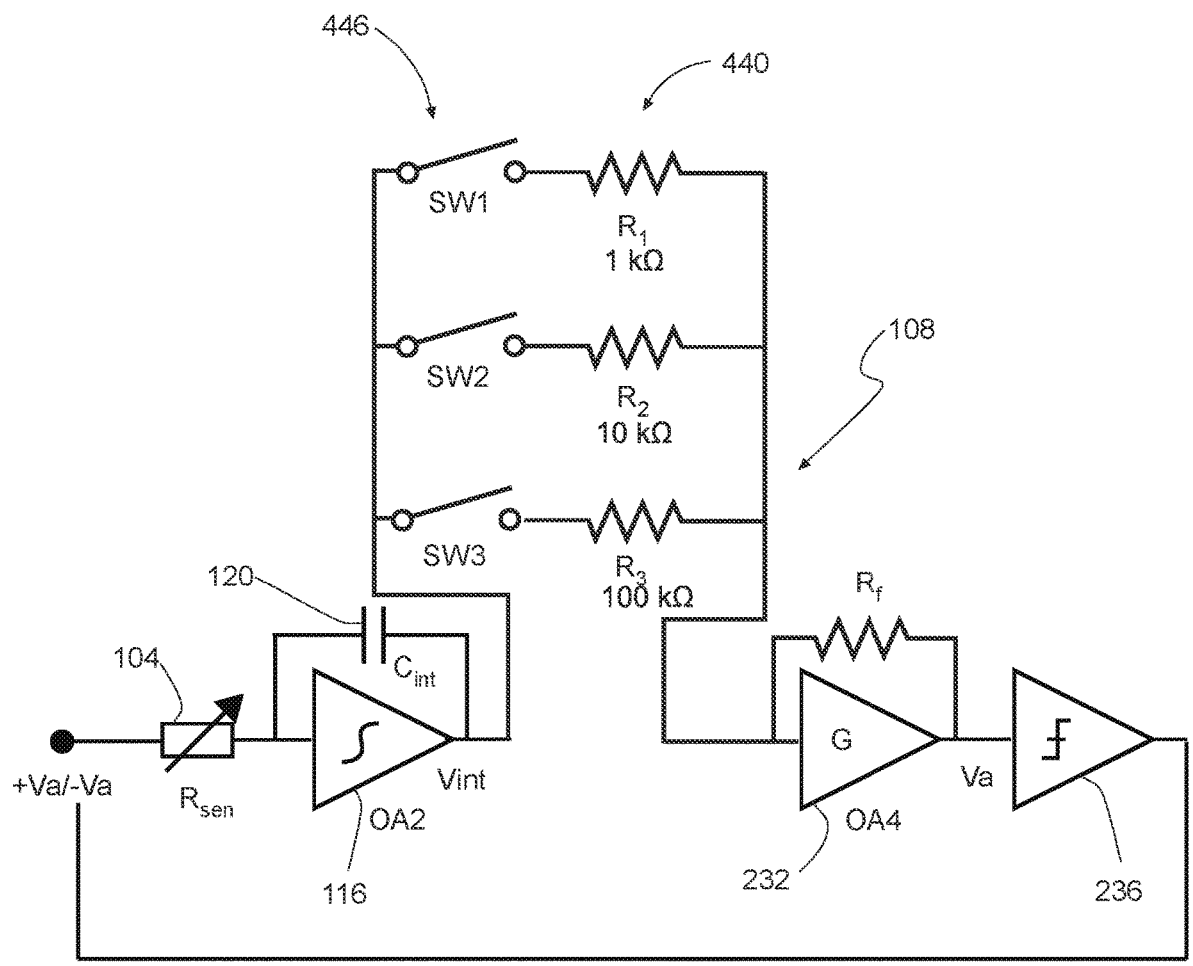
FIG. 4 is a schematic diagram of the analog front end with an array of resistors of the sensor interface of FIG. 1.

FIG. 4 further illustrates a portion of the analog front end 108. As described above, the gain stage 232 of the analog front 108 can have an operational amplifier OA4 with a gain G determined by a resistance ratio of resistors coupled to the operational amplifier OA4. The resistors coupled to the operational amplifier OA4 can comprise the input resistor $R_{in}$ (FIGS. 2 and 3) coupled to the operational amplifier OA4 and the feedback resistor $R_f$ across the operational amplifier OA4. The resistors can comprise an array 440 of different resistors R1-R3 selectively connectable to the operational amplifier OA4. In one aspect, the input resistor $R_{in}$ (FIGS. 2 and 3) can comprise the array 440 of different resistors R1-R3 selectively electrically connectable to the operational amplifier OA4, as shown. In another aspect, the reference resistor $R_f$ can comprise the array 440 of different resistors selectively electrically connectable across the operational amplifier OA4. In addition, an array 446 of switches can be coupled between an input and the array 440 of the different resistors R1-R3. In one aspect, each resistor R1-R3 can be associated with a different switch. The SDC 124 (FIG. 1) can control the switches to change the resistance ratio, and thus the gain G, of the operational amplifier OA4.

The array 336 of capacitors C1-C3 (FIG. 3) and the array 440 of resistors R1-R3 (FIG. 4) can be combined. Referring to FIGS. 3 and 4, the sensor interface 100 (FIG. 1) can provide for variable ranges of sensor resistance Rsen using the variable integrator capacitance Cint of the array 336 of capacitors C1-C3 and the variable gain G, and the variable resistance $R_{in}$ or $R_f$, of the array 440 of resistors R1-R3. The variable ranges of sensor resistance $R_{sen}$ can be provided for using a variable integration factor or variable integrator capacitor $C_{int}$ and a variable gain factor or variable resistor $R_{in}$ and/or $R_f$. Thus, the sensor interface 100 can interface with resistive sensors 104 from 5 kOhms to 50+Gohms. The variable integrator capacitor Cint and the variable resistance Rin and/or Rf (variable gain G) can also help keep the analog front end 108 and the integration stage 116 stable when the sensor resistance $R_{sen}$ gets too small (i.e. making the integration stage 116 oscillate too fast). The variable integrator capacitor $C_{int}$ can also allow a very low power for the analog front end 108 by limiting the maximum oscillating speed of the integration stage 116. When the sensor resistance $R_{sen}$ gets too high, the analog front end 108 can use a high gain G and small integration capacitor 120 to increase the sampling rate of the analog front end 108 and get better data and measurement.

Figure 5:
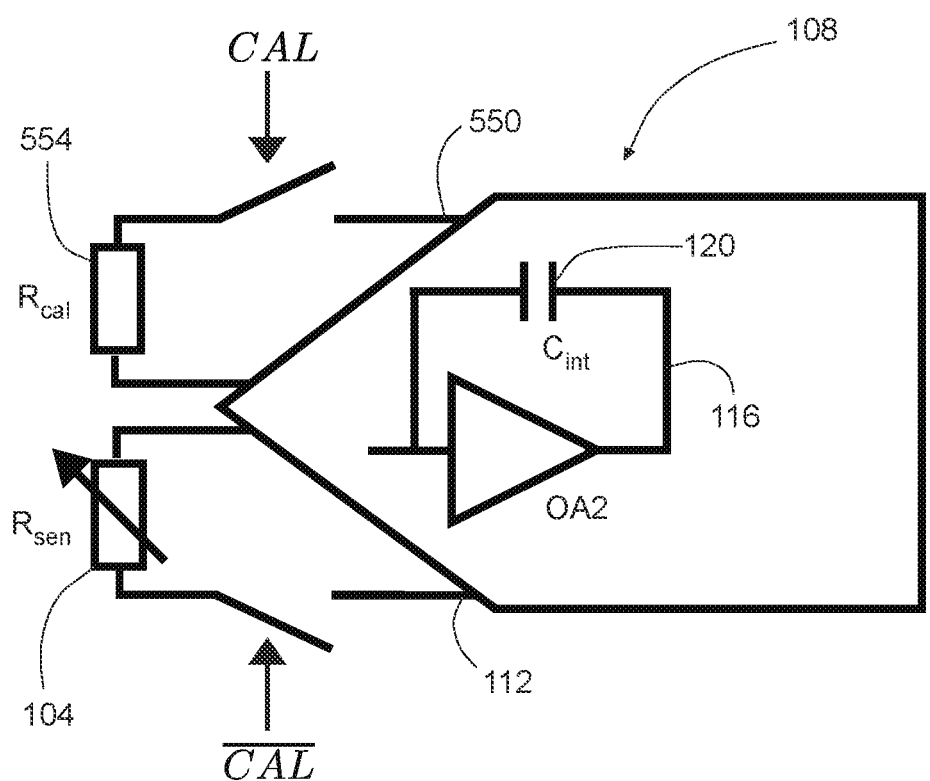
FIG. 5 is a schematic diagram of a dynamic calibration of the analog front end of the sensor interface of FIG. 1.

FIG. 5 further illustrates a portion of the analog front end 108. The SDC 124 (FIG. 1) can be configured to periodically switch the analog front end 108 between a measurement mode, described above to measure and calculate the sensor resistance $R_{sen}$, and a calibration mode to calibrate the integrator capacitance $C_{int}$. The analog front end 108 can further have an analog input/output (I/O) calibration port 550 that can be coupled to a precision resistor 554 with a precision resistance $R_{cal}$. The integration stage 116 (FIGS. 1-4) can thus oscillate at an oscillation frequency that is proportional to the precision resistance $R_{cal}$. The SDC 124 (FIG. 1) can compute the integrator capacitance $C_{int}$ based on the oscillation frequency and the precision resistance $R_{cal}$ of the precision resistor 554.

The SDC 124 can automatically switch to the calibration mode, and between the sensor resistor 104 and the precision resistor 554. One source of error in the sensor interface 100 (FIG. 1) when estimating the value of the sensor resistance $R_{sen}$ can come from the integration capacitance $C_{int}$ of the capacitor 120 (FIGS. 1-4), used in equation (2). An integrated circuit can match different components well so that the gain G in equation (2) may not be a source of error. Because the gain G relies on a ratio of resistance, typical error of below 1% can be achieved. However, it can be difficult to estimate the raw value of components, such as the integration capacitance $C_{int}$ which can vary over a large range (e.g. a 20% mismatch). Thus, the external precision resistor $R_{cal}$ can be utilized. Every few measurements, the SDC 124 (FIG. 1) can toggle to the calibration mode and switch the input resistance from the sensor resistor 104 to the precision resistor 554. Based on the measured time constant t, the SDC 124 can calibrate the value of the integration capacitor $C_{int}$ of the integration capacitance 120.

The integration capacitance $C_{int}$ during calibration mode can be calculated using equation (3):

$$C = \frac{Nck}{4 \cdot Gcal \cdot Rcal \cdot Ncomp - cal} \cdot Tck \quad (3)$$

The integration capacitance $C_{int}$ from equation (3) can be substituted into equation (2) for the sensor resistance $R_{sen}$ resulting in equation (4):

$$R_{sen} = \frac{Gcal \cdot Ncomp - cal \cdot Rcal}{Gsen \cdot Ncomp - cal} \quad (4)$$

With a constant measurement period and reference clock frequency, the equation for the sensor resistor 104 can be a proportional relation with the reference resistor 554 using the gain G and counts of the calibration and sensing. The sensing calculation can therefore be independent of the reference clock frequency, measurement period, and capacitor value. The computed value of the sensor resistance $R_{sen}$ can be defined by equation (4). Gcal and Gsen correspond to the gain during calibration and the gain during sensing respectively; Ncal and Nsen are the counts during calibration and during sensing respectively; and Rcal is the precision resistor value in ohms.

Another source of error can be when the analog front end 108 or integration stage 116 does not operate in linear mode, which can happen when the circuit frequency is too high due to the input sensor resistor 104 being out of operating range which is shown in table I. If the sensor resistance $R_{sen}$ gets too low for some given gain G and/or integration capacitance $C_{int}$ values, the analog front end 108 and integration stage 116 can start to oscillate very fast. One issue is that the operational amplifiers can be limited in both their frequency response and their slew-rate, which add non-linearity in the analog front end 108 and the output frequency may no longer be a function of the input sensor resistance $R_{sen}$. Another is that the analog front end 108 and the integration stage 116 may oscillate too fast. Some resistive sensors 104 can have intrinsic impedance that can be a function of frequency. In addition, a timing error can be introduced by the comparator 236 (FIGS. 2-4) if the speed of the comparator 236 is not significantly higher than the oscillating frequency of the analog front end 108. The comparator 236 can have a maximum frequency $F_{max}$>40 MHz and a voltage offset $V_{offset}$<100 µV.

Figure 6:
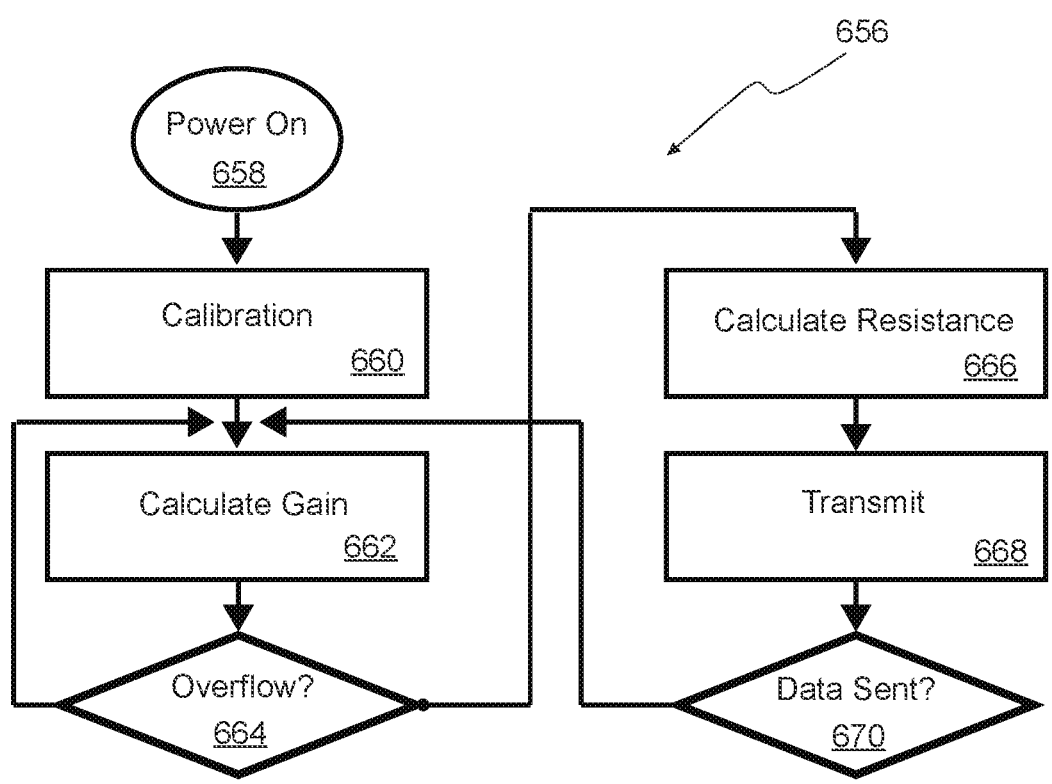
FIG. 6 is a flow chart illustrating a smart digital controller (SDC) of the sensor interface of FIG. 1.

FIG. 6 illustrates the flow chart 656 of the SDC 124 (FIG. 1). The SDC 124 can handle both the automatic calibration of the sensor interface 100 (FIG. 1) and the automatic range of the analog front-end 108 (FIG. 1). Manual calibration and operating range by command from the UART controller 128 (FIG. 1) can also disable the automatic calibration and/or overflow detection. The sensor interface 100 (FIG. 1) can power on 658 and enter a calibration mode to calibrate 660 the integrator capacitor Cint and calculate 662 the gain G. If there is an overflow 664, the variable resistance Rin and/or Rf, and the array 440 (FIG. 4) of resistors R1-R3, can be varied, and the gain G can be calculated 662. If there is no overflow, then the sensor resistance $R_{sen}$ of the resistance sensor 104 (FIG. 1) can be calculated 666 by the SDC 124 (FIG. 1), as described herein. The calculated sensor resistance $R_{sen}$ can be transmitted 668 by the UART controller 128. If the sensor resistance $R_{sen}$ was sent 670, then the gain G calculation 662, overflow 664, resistance calculation 666 and transmission 668 can be repeated.

Figure 7:
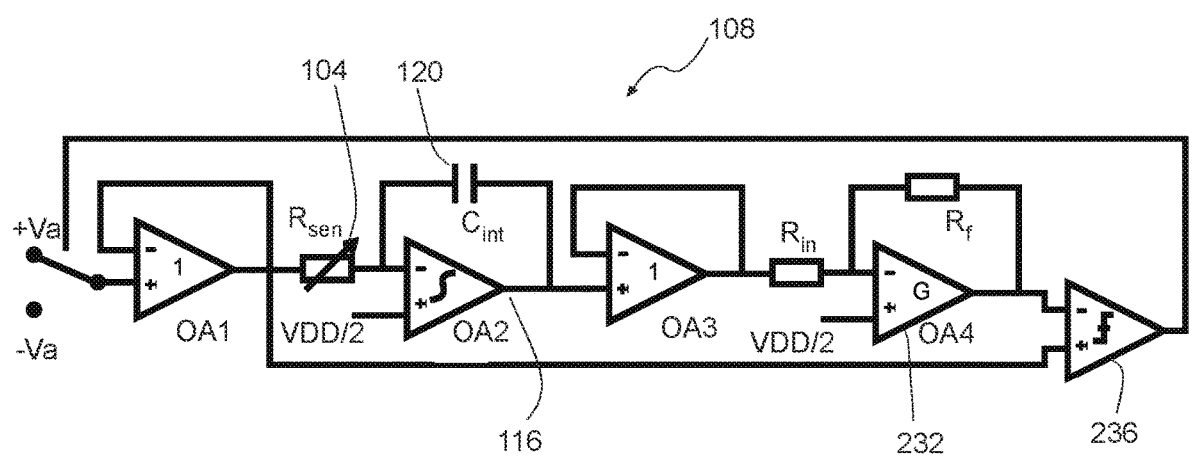
FIG. 7 is a schematic block diagram of the analog front end of the sensor interface of FIG. 1.

FIG. 7 illustrates the analog front end 108 in greater detail with respect to FIG. 2. The analog front end 108 can also have voltage buffers. A first buffer OA1 can ensure current delivery to the integration stage 116 when the sensor resistance $R_{sen}$ of the resistive sensor 104 is low. A second buffer OA3 can separate an input impedance of the gain stage 232 from the integration stage 116. The analog front end 108 can also have analog switches for the input reference voltage, not shown. In one example, the maximum toggling frequency of the sensor interface 100 (FIG. 1) can be set to be at 400 kHz to avoid capacitive behavior of the resistive sensors 104. An input to the first buffer OA1 can be toggled between the two reference voltages. The resulting buffered signal can be toggle between Va and −Va in about 10 ns to properly charge the integration capacitor 120. The current can flow through the integration capacitor 120 and into the output of the integration stage 116. Both buffers OA1 and OA3 can provide and draw enough current. The first buffer OA1 can toggle very fast when its input is toggled, and the amplifier OA2 of the integration stage 116 can have a very low input bias current, when the sensor interface 100 interfaces a very high value of sensor resistance $R_{sen}$ (e.g. GΩ range). Since the maximum toggling frequency of the sensor interface 100 can be set to be at 400 kHz, every amplifier in the analog front end 108 can have a slew-rate large enough to keep the sensor interface 100 in linear mode. The performance specifications of the amplifiers are provided in table II.

TABLE II specifications of amplifiers.

| Parameter | OA1 | OA2 | OA3 | OA4 |
|---|---|---|---|---|
| $I_{out}$ | >250 μA | >250 μA | NA | NA |
| $t_s$ | <50 ns | NA | NA | NA |
| ε | <0.001% | <0.001% | <0.001% | <0.001% |
| $f_u$ | >5 MHz | >5 MHz | >5 MHz | >500 MHz |
| SR | >5 V/μs | >5 V/μs | >5 V/μs | >5 V/μs |
| $I_{in}$ | NA | <0.2 pA | NA | NA |
| PM | 45° | 60° | 60° | 60° |

Figure 8:
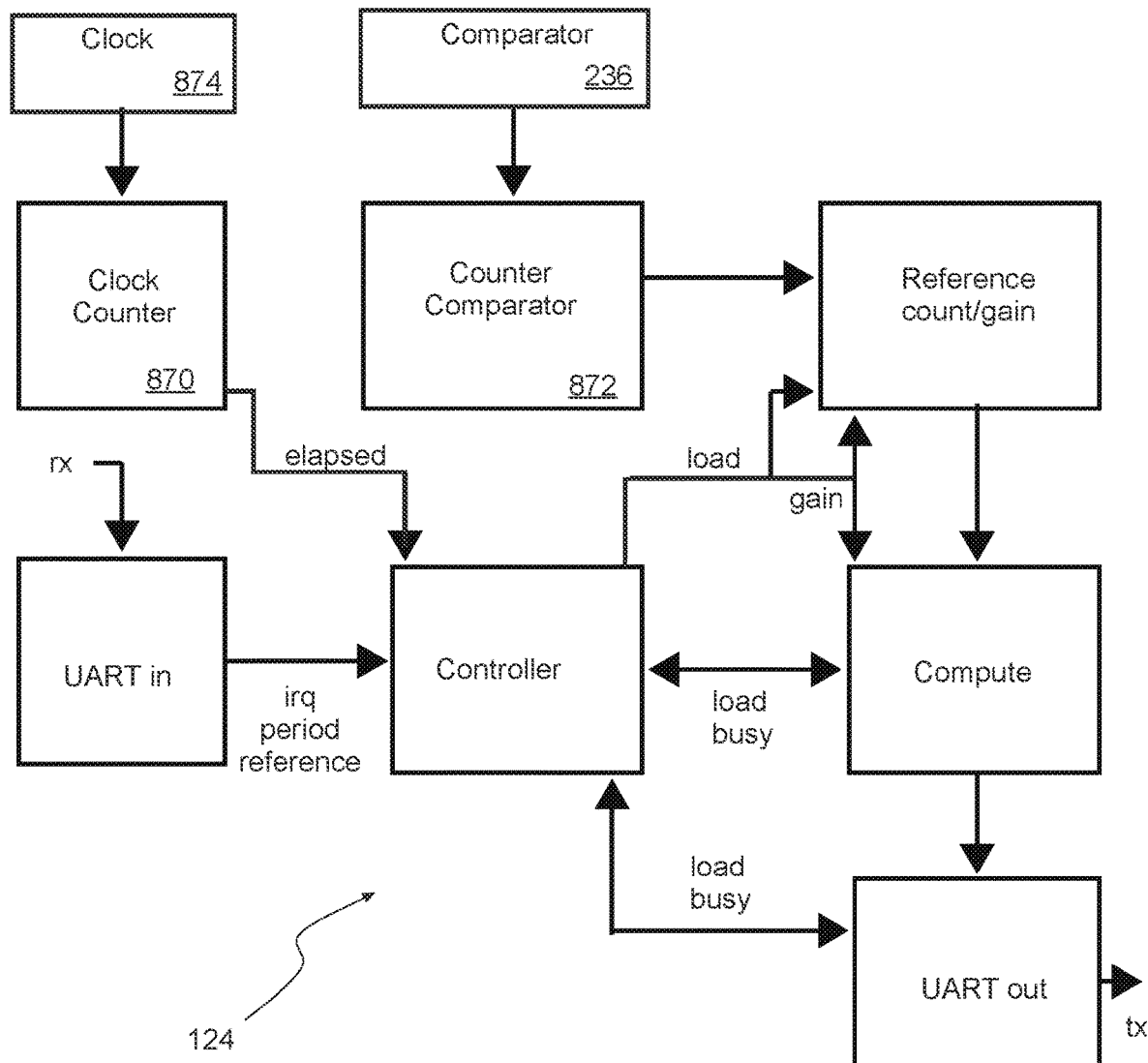
FIG. 8 is a block diagram of the SDC of the sensor interface of FIG. 1.

FIG. 8 illustrates the functionality of the SDC 124 (FIG. 1). The SDC 124 can utilize a finite state machine to control switching between the calibration, calculation, measurement, and broadcast states. The calibration and measurement modes were previously described.

The core measurement functionality of the SDC 124 can be implemented as a pair of counters 870 and 872. One counter 870 can be used to measure the elapse time for the sample period and can increment on each cycle of the system reference clock 874. The second counter 872 increments on each cycle of the output oscillation of the analog front end 108 (FIG. 1).

Periodically the SDC 124 can connect the reference resistor 554 (FIG. 5) in place of the resistive sensor 104 (FIG. 5) under measurement using transmission gates controlled by the SDC 124. The gain G during calibration mode and the reference count of the integration capacitor 120 can be stored in a calibration register.

The gain G can be varied between 1, 10, and 100. In addition, the gain G can be controlled by the SDC 124. While the sensor interface 100 is running, the counter 770 output can be checked for an underflow or overflow condition and adjusted. This can prevent instability or loss of resolution if the integration stage 116 (FIG. 1) is charging too quickly or too slowly. The design choice of powers of ten in the gain G of the analog front end 108 can increase the complexity of the calculation. In another aspect, the gain G can increase by powers of two for ease of binary calculation.

Calculating the sensor resistance $R_{sen}$ in equation (4) may require a large arithmetic logic circuit. As previously mentioned, the analog front end 108, the SDC 124 and the UART controller 128 can be formed in an IC, such as the ASIC. Area on the ASIC can be a concern due to sharing die space with the analog circuitry of the analog front end 108. Because the sample period can be measured in hundreds of milli seconds, any delays during calculation may be acceptable. The arithmetic can be implemented using pipeline multiplier and dividers done in fixed point binary. The pipeline multiplier and divider can include a series of shift and addition/subtraction operations. This strategy can provide a compact circuit, at the expense of runtime. Each shift and add operation may require one clock cycle, for a total number of cycles equal to the number of bits. The implementation may have a single addition operation per cycle, which reduces the size of the circuit. Resolution of the resistance measurement in the current design is 40 bits.

The SDC 124 can communicate via a serial UART controller 128. This can allow transmission of the data, and to receive configuration commands. The measured sensor resistance Rsen can be broadcast over the UART controller 128 periodically after each measurement. The parameters that can be configured via the UART controller 128 can include the sample period used by the clock counter 770 and the value of the reference resistor Rcal. The SDC 124 can boot with a set of default parameters without an initial configuration.

The performance of the ASIC with the sensor interface 100 can be compared to prior resistance to digital interfaces. Some prior high dynamic range resistance interfaces can be capped at 1 GΩ. Such prior interfaces may lack dynamic range to be compatible with highly resistive sensors. Nano-fiber-based sensors and their counterparts may not be interfaced. Some interfaces can interface 100G sensors but have lower range limitation that can be too high (e.g. 470 kΩ) to interface a wide variety of sensors. Another issue with prior interfaces is their output sampling rate. Having samples in the 10s of seconds may limit the bandwidth of the signal of interest to DC measurement and any spikes in the chemical population (e.g. a group of molecules carried by wind) may be filtered out in the process. The response of some nano-fiber-based sensors to a large step of chemicals may have a signal of interest that remains in the lower 1 Hz which may result in an output sampling rate near 200 ms to properly follow the output response of highly resistive sensors.

Figure 9:
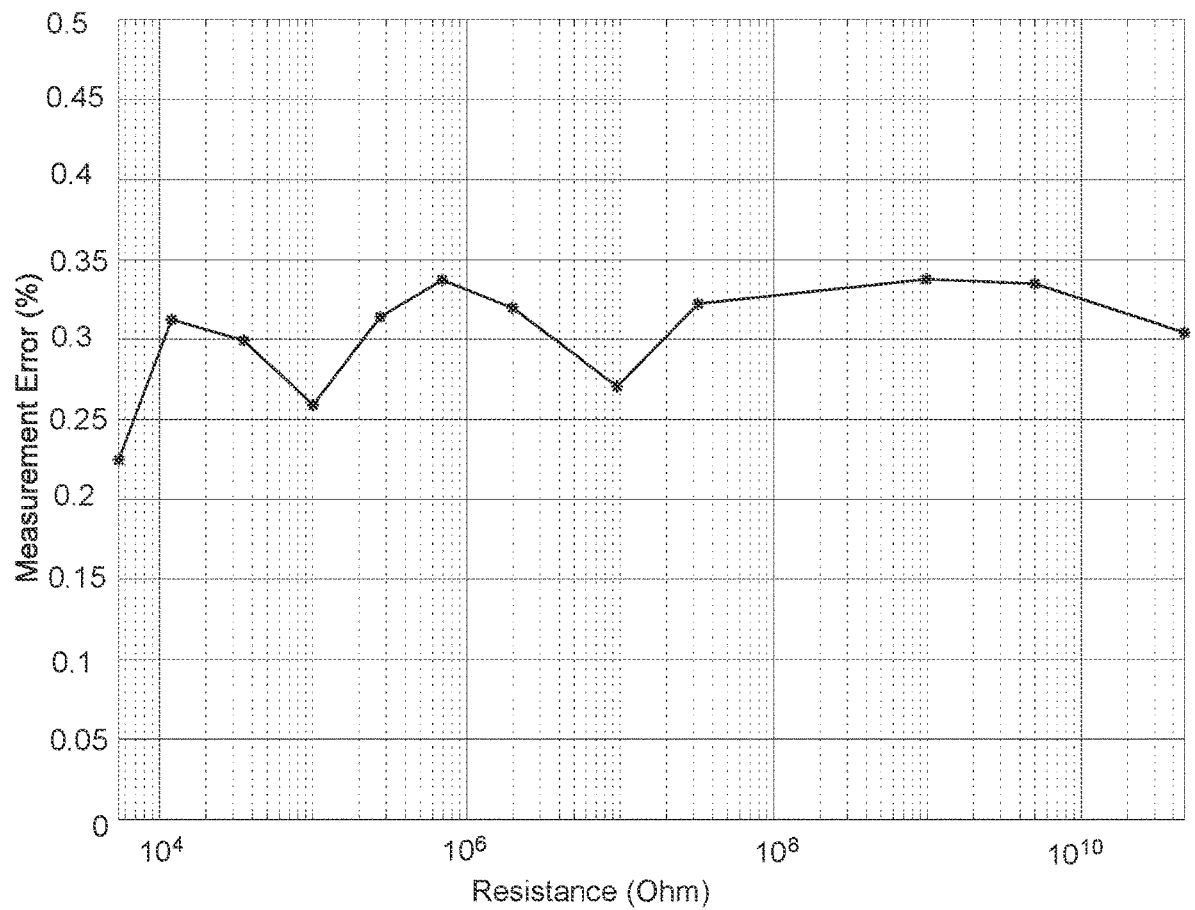
FIG. 9 is a graph of measurement error versus input resistance value of the sensor interface of FIG. 1.

The sensor interface 100 can be fabricated in a 180 nm process node. The ASIC can be packaged in a DIP-28 package. Post-silicon results are shown in FIG. 9. The sensor interface 200 can interface a chemi-resistive sensor 104 from 5 kΩ to 50 GΩ which is wider than some prior resistance-to-digital interfaces. The sensor interface 100 can have a power consumption as low as 5.3 mW and area as low as <1 mm² to scale the number of channels.

Corner analysis and parasitic extraction PEX simulations may be passed for commercial and industrial temperature standards from −10° C. to 80° C. across all corners. The chip has been tested across temperatures from −40 to 105° C. For this test, the chip was interfacing a 0.05%, 0.2 ppm/C reference resistance $R_{sen}$ of 100 kΩ. The chip maintained a relative measurement error below 1%, or equivalently 6.5 effective number of bits across the whole temperature range from −40° C. to 105° C. The value of 6.5 bits of Effective Number of Bits (ENOB) was chosen to be on par with prior interfaces. This temperature range may be compatible with commercial and industrial standards.

The development of Smart-Cities and high-density chemical monitoring stations may require low-cost, low-power sensor interfaces because many sensor interfaces may be used, and the sensor interfaces may be battery-powered. The sensor interface 100 can be a 6 mW plug-and-play resistance-to-digital interface in a 180 nm CMOS process node. The sensor interface can use a resistance and capacitance (RC) measuring circuitry to directly interface the resistive sensor 104 and convert its intrinsic resistance $R_{sen}$ to a frequency. The integrated SDC 124 can ensure stability of the system and non-saturation while also sending the computed samples over the integrated UART controller 128. Five sensor interfaces 100 can be manufactured on the smallest die size available while showing a fivefold improvement in term of sampling frequency and threefold decrease in term of measurement error. Autonomous smart use of the variable gain G and on-board capacitance Cint increases the dynamic range by 20 dB against prior interfaces. Post-silicon testing showed that the ASIC can interface resistances $R_{sen}$ from 5 kΩ to 50 GΩ with a less than 0.35% in measurement error. The ASIC performance was on par with prior interfaces across industrial temperature range standards and kept a 1% measurement error from −40° C. to 105° C.

While the flowcharts presented for this technology may imply a specific order of execution, the order of execution may differ from what is illustrated. For example, the order of two more blocks may be rearranged relative to the order shown. Further, two or more blocks shown in succession may be executed in parallel or with partial parallelization. In some configurations, one or more blocks shown in the flow chart may be omitted or skipped. Any number of counters, state variables, warning semaphores, or messages might be added to the logical flow for purposes of enhanced utility, accounting, performance, measurement, troubleshooting or for similar reasons.

Some of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more blocks of computer instructions, which may be organized as an object, procedure, or function. Nevertheless, the executables of an identified module need not be physically located together, but may comprise disparate instructions stored in different locations which comprise the module and achieve the stated purpose for the module when joined logically together.

Indeed, a module of executable code may be a single instruction, or many instructions and may even be distributed over several different code segments, among different programs and across several memory devices. Similarly, operational data may be identified and illustrated herein within modules and may be embodied in any suitable form and organized within any suitable type of data structure. The operational data may be collected as a single data set, or may be distributed over different locations including over different storage devices. The modules may be passive or active, including agents operable to perform desired functions.

The technology described here may also be stored on a computer readable storage medium that includes volatile and non-volatile, removable and non-removable media implemented with any technology for the storage of information such as computer readable instructions, data structures, program modules, or other data. Computer readable storage media include, but is not limited to, a non-transitory machine readable storage medium, such as RAM, ROM, EEPROM, flash memory or other memory technology, CD-ROM, digital versatile disks (DVD) or other optical storage, magnetic cassettes, magnetic tapes, magnetic disk storage or other magnetic storage devices, or any other computer storage medium which may be used to store the desired information and described technology.

The devices described herein may also contain communication connections or networking apparatus and networking connections that allow the devices to communicate with other devices. Communication connections are an example of communication media. Communication media typically embodies computer readable instructions, data structures, program modules and other data in a modulated data signal such as a carrier wave or other transport mechanism and includes any information delivery media. A "modulated data signal" means a signal that has one or more of its characteristics set or changed in such a manner as to encode information in the signal. By way of example and not limitation, communication media includes wired media such as a wired network or direct-wired connection and wireless media such as acoustic, radio frequency, infrared and other wireless media. The term computer readable media as used herein includes communication media.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. A sensor interface for a resistive sensor, comprising:
    an analog front end comprising:
        an analog input/output (I/O) sensor port configured to be coupled to the resistive sensor;
        an integration stage coupled to the analog I/O sensor port and configured to oscillate at an oscillation frequency that is proportional to a sensor resistance of the resistive sensor, the integration stage having a variable integrator capacitance configured to vary the oscillation frequency; and
        a gain stage coupled to the integration stage and having a variable gain configured to vary the oscillation frequency of the integration stage;

a smart digital controller (SDC) coupled to the analog front end and configured to compute the sensor resistance of the resistive sensor based on the oscillation frequency; and the SDC configured to automatically detect unstable oscillation in the integration stage and cause the variable gain and the variable integrator capacitance to change.

2. The sensor interface of claim 1, wherein the integration stage of the analog front end further comprises:
an operational amplifier (OA);
an array of different capacitors selectively connectable to the OA;
at least one switch coupled between an input and at least one of the different capacitors; and
the SDC configured to control the at least one switch to change the variable integrator capacitance.

3. The sensor interface of claim 1, wherein the gain stage of the analog front end further comprises:
an operational amplifier (OA) with a gain determined by a resistance ratio of resistors coupled to the OA;
the resistors comprising an array of different resistors selectively connectable to the OA;
at least one switch coupled between an input and at least one of the different resistors; and
the SDC configured to control the at least one switch to change the resistance ratio, and the gain, of the OA.

4. The sensor interface of claim 3, wherein the gain stage of the analog front end further comprises:
the resistors coupled to the OA comprise an input resistor coupled to the OA and a feedback resistor across the OA; and
the input resistor comprising the array of different resistors selectively electrically connectable to the OA.

5. The sensor interface of claim 1, further comprising:
a universal asynchronous receiver-transmitter (UART) controller coupled to the SDC and configured to transmit the sensor resistance computed by the SDC.

6. The sensor interface of claim 1, wherein the sensor interface has an operating range of 5 kΩ to 50 GΩ.

7. The sensor interface of claim 1, wherein the integration stage further comprises:
an operation amplifier (OA) configured to be coupled to the resistive sensor;
an integration capacitor coupled across the OA;
the integration stage configured to oscillate as a function of a sensor resistance (Rsen) of the resistive sensor and a capacitance (Cint) of the integration capacitor and having an integrator time constant (tau) which is a product of the sensor resistance and the capacitance (tau=Rsen*Cint); and
the SDC is configured to compute the sensor resistance of a variable resistor by comparing the integrator time constant (tau) to a time reference.

8. The sensor interface of claim 1, wherein the SDC is configured to periodically switch the analog front end between a measurement mode and a calibration mode to calibrate the integrator capacitance.

9. The sensor interface of claim 8, wherein the analog front end further comprises:
an analog input/output (I/O) calibration port configured to be coupled to a precision resistor with a precision resistance;
the integration stage configured to oscillate at an oscillation frequency that is proportional to the precision resistance; and the SDC configured to compute the integrator capacitance based on the oscillation frequency and the precision resistance of the precision resistor.

10. The sensor interface of claim 1, wherein the analog front end, the SDC and a universal asynchronous receiver-transmitter (UART) controller are formed in an integrated circuit (IC).

11. The sensor interface of claim 1, in combination with a resistive gas sensor, and further comprising:
the resistive gas sensor having the sensor resistance that varies proportionally relative to a concentration of a gas exposed to the resistive sensor; and
the SDC configured to compute the sensor resistance to enable the concentration of the gas exposed to the resistive sensor to be determined.

12. A sensor interface for a resistive sensor, comprising:
an analog front end comprising:
an analog input/output (I/O) sensor port configured to be coupled to the resistive sensor;
an analog I/O calibration port configured to be coupled to a precision resistor with a precision resistance; and
an integration stage coupled to the analog I/O sensor port and the analog I/O calibration port, the integration stage configured to oscillate at an oscillation frequency that is proportional to a sensor resistance of the resistive sensor or the precision resistance of the precision resistor, the integration stage having a variable integrator capacitance configured to vary the oscillation frequency;
a smart digital controller (SDC) coupled to the analog front end and configured to compute the sensor resistance of the resistive sensor based on the oscillation frequency;
the SDC being configured to periodically switch the analog front end between a measurement mode and a calibration mode to calibrate the integrator capacitance; and
the SDC configured to compute the integrator capacitance based on the oscillation frequency and the precision resistance of the precision resistor.

13. The sensor interface of claim 12, wherein the integration stage of the analog front end further comprises:
an operational amplifier (OA);
an array of different capacitors selectively connectable to the OA;
at least one switch coupled between an input and at least one of the different capacitors; and
the SDC configured to control the at least one switch to change the variable integrator capacitance.

14. The sensor interface of claim 12, further comprising:
the analog front end further comprising a gain stage coupled to the integration stage and having a variable gain configured to vary the oscillation frequency of the integration stage; and
the SDC configured to automatically detect unstable oscillation in the integration stage and cause the variable gain and the variable integrator capacitance to change.

15. The sensor interface of claim 14, wherein the gain stage of the analog front end further comprises:
an operational amplifier (OA) with a gain determined by a resistance ratio of resistors coupled to the OA;
the resistors comprising an array of different resistors selectively connectable to the OA;
at least one switch coupled between an input and at least one of the different resistors; and
the SDC configured to control the at least one switch to change the resistance ratio, and the gain, of the OA.

16. The sensor interface of claim 15, wherein the gain stage of the analog front end further comprises:
the resistors coupled to the OA comprise an input resistor coupled to the OA and a feedback resistor across the OA; and
the input resistor comprising the array of different resistors selectively electrically connectable to the OA.

17. The sensor interface of claim 12, further comprising:
a universal asynchronous receiver-transmitter (UART) controller coupled to the SDC and configured to transmit the sensor resistance computed by the SDC.

18. The sensor interface of claim 12, wherein the analog front end, the SDC and a universal asynchronous receiver-transmitter (UART) controller are formed in an integrated circuit (IC).

19. A sensor interface for a resistive sensor, comprising:
an analog front end comprising:
an analog input/output (I/O) sensor port configured to be coupled to the resistive sensor;
an analog I/O calibration port configured to be coupled to a precision resistor with a precision resistance;
an integration stage coupled to the analog I/O sensor port and the analog I/O calibration port, the integration stage configured to oscillate at an oscillation frequency that is proportional to a sensor resistance of the resistive sensor or the precision resistance of the precision resistor, the integration stage having a variable integrator capacitance configured to vary the oscillation frequency; and
a gain stage coupled to the integration stage and having a variable gain configured to vary the oscillation frequency of the integration stage;
a smart digital controller (SDC) coupled to the analog front end and configured to compute the sensor resistance of the resistive sensor based on the oscillation frequency;
the SDC configured to automatically detect unstable oscillation in the integration stage and cause the variable gain and the variable integrator capacitance to change;
the SDC being configured to periodically switch the analog front end between a measurement mode and a calibration mode to calibrate the integrator capacitance; and
the SDC configured to compute the integrator capacitance based on the oscillation frequency and the precision resistance of the precision resistor.

20. The sensor interface of claim 19, wherein the gain stage of the analog front end further comprises:
an operational amplifier (OA) with a gain determined by an input resistor coupled to the OA and a feedback resistor across the OA;
the input resister comprising an array of different resistors selectively connectable to the OA;
at least one switch coupled between an input and at least one of the different resistors; and
the SDC configured to control the at least one switch to change a resistance ratio, and the gain, of the OA.

* * * * *